US012538830B2

(12) United States Patent
Attar et al.

(10) Patent No.: US 12,538,830 B2
(45) Date of Patent: *Jan. 27, 2026

(54) METHOD AND APPARATUS FOR DEBONDING TEMPORARILY BONDED WAFERS IN WAFER-LEVEL PACKAGING APPLICATIONS

(71) Applicant: NCC NANO, LLC, Dallas, TX (US)

(72) Inventors: Vahid Akhavan Attar, Austin, TX (US); Vikram S. Turkani, Austin, TX (US)

(73) Assignee: PULSEFORGE, INC., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/661,613

(22) Filed: May 11, 2024

(65) Prior Publication Data

US 2024/0297144 A1 Sep. 5, 2024

Related U.S. Application Data

(62) Division of application No. 17/122,796, filed on Dec. 15, 2020, now Pat. No. 11,996,384.

(51) Int. Cl.
*B23K 1/00* (2006.01)
*B23K 1/018* (2006.01)
*H01L 23/00* (2006.01)

(52) U.S. Cl.
CPC ............ *H01L 24/799* (2013.01); *B23K 1/018* (2013.01); *H01L 24/98* (2013.01)

(58) Field of Classification Search
CPC . H01L 24/799; H01L 24/98; H01L 21/67115; H01L 21/67092; H01L 2221/68318; H01L 2221/68327; H01L 2221/68381; H01L 21/6835; B23K 1/018
USPC .................................. 228/13, 164, 191, 119
See application file for complete search history.

(56) References Cited

U.S. PATENT DOCUMENTS

| | | | |
|---|---|---|---|
| 6,600,127 B1 | 7/2003 | Peterson et al. |
| 6,653,591 B1 | 11/2003 | Peterson et al. |
| 6,916,389 B2 | 7/2005 | Pesiri et al. |
| 7,012,214 B2 | 3/2006 | Schroder et al. |
| 7,126,081 B2 | 10/2006 | Schroder et al. |
| 7,262,384 B2 | 8/2007 | Jackson |
| 7,477,500 B2 | 1/2009 | Schmidt et al. |
| 7,543,170 B2 | 6/2009 | Ross et al. |
| 7,820,097 B2 | 10/2010 | Schroder et al. |

(Continued)

FOREIGN PATENT DOCUMENTS

| | | | | |
|---|---|---|---|---|
| CN | 110416148 A | | 11/2019 | |
| DE | 102014101716 A1 | * | 8/2015 | ........ H01L 21/67115 |

(Continued)

*Primary Examiner* — Kiley S Stoner
(74) *Attorney, Agent, or Firm* — Stinson LLP

(57) ABSTRACT

A method for debonding a wafer from a bonded wafer stack is disclosed. Initially, a light-absorbing layer is placed on a carrier. A wafer is then attached to the light-absorbing layer of the carrier via an adhesive layer to form a bonded wafer stack. After processing the wafer has been processed, a light pulse from a flashlamp is applied to a non-wafer side of the carrier to heat the light-absorbing layer and the adhesive layer in order to loosen the wafer from the bonded wafer stack. Finally, the wafer is removed from the bonded wafer stack.

16 Claims, 3 Drawing Sheets

(56) References Cited

U.S. PATENT DOCUMENTS

| | | |
|---|---|---|
| 8,361,257 B2 | 1/2013 | Schroder |
| 8,505,427 B2 | 8/2013 | Wilson et al. |
| 8,674,618 B2 | 3/2014 | Shroder et al. |
| 8,857,342 B2 | 10/2014 | Wilson et al. |
| 8,969,177 B2 | 3/2015 | Chowdhury et al. |
| 9,494,068 B2 | 11/2016 | Schroder et al. |
| 9,543,197 B2 | 1/2017 | Hu et al. |
| 9,631,283 B2 | 4/2017 | Schroder et al. |
| 9,907,183 B2 | 2/2018 | Schroder et al. |
| 10,011,104 B2 | 7/2018 | Hendriks et al. |
| 10,422,578 B2 | 9/2019 | Jackson et al. |
| 10,537,029 B2 | 1/2020 | Pope et al. |
| 10,553,450 B2 | 2/2020 | Schroder et al. |
| 10,833,049 B2 | 11/2020 | Brunschwiler et al. |
| 10,986,698 B2 | 4/2021 | Schroder et al. |
| 11,089,690 B2 | 8/2021 | Hendriks et al. |
| 11,230,509 B2 | 1/2022 | Schroder et al. |
| 11,317,517 B2 | 4/2022 | Ghosh et al. |
| 11,621,175 B1 | 4/2023 | Rose et al. |
| 11,647,594 B2 | 5/2023 | Hendriks |
| 11,688,600 B1 | 6/2023 | Rose et al. |
| 11,769,660 B2 | 9/2023 | Alex et al. |
| 11,840,648 B2 | 12/2023 | Miyazawa et al. |
| 11,996,384 B2 | 5/2024 | Attar et al. |
| 12,084,599 B2 | 9/2024 | Miyazawa et al. |
| 2004/0178173 A1 | 9/2004 | Chang et al. |
| 2006/0071639 A1 | 4/2006 | Ross et al. |
| 2006/0071640 A1 | 4/2006 | Mccool et al. |
| 2007/0004171 A1 | 1/2007 | Arana |
| 2008/0006521 A1 | 1/2008 | Schroder et al. |
| 2008/0028922 A1 | 2/2008 | Wilson et al. |
| 2008/0128694 A1 | 6/2008 | Arita et al. |
| 2009/0203285 A1 | 8/2009 | Kobayashi |
| 2010/0092718 A1 | 4/2010 | Shin et al. |
| 2010/0144097 A1 | 6/2010 | Koroku et al. |
| 2010/0266373 A1 | 10/2010 | George et al. |
| 2012/0037068 A1 | 2/2012 | Su et al. |
| 2012/0064669 A1 | 3/2012 | Higuchi |
| 2013/0087959 A1 | 4/2013 | Tran |
| 2013/0220687 A1 | 8/2013 | Tagami et al. |
| 2013/0244400 A1 | 9/2013 | George et al. |
| 2014/0154427 A1 | 6/2014 | Edd et al. |
| 2014/0154868 A1 | 6/2014 | Sugo et al. |
| 2014/0220765 A1 | 8/2014 | Nakajima |
| 2015/0184032 A1 | 7/2015 | Iwai et al. |
| 2016/0093522 A1 | 3/2016 | Tagami et al. |
| 2016/0189996 A1 | 6/2016 | Tanabe et al. |
| 2016/0209743 A1 | 7/2016 | Uchigasaki et al. |
| 2017/0008082 A1 | 1/2017 | Chen |
| 2017/0194540 A1 | 7/2017 | Liu et al. |
| 2017/0251550 A1 | 8/2017 | Su |
| 2018/0151804 A1 | 5/2018 | Chaji et al. |
| 2018/0182709 A1 | 6/2018 | Jaywant |
| 2019/0230796 A1 | 7/2019 | Hendriks |
| 2019/0299496 A1 | 10/2019 | Hendriks et al. |
| 2019/0348573 A1 | 11/2019 | Raymond et al. |
| 2020/0127326 A1 | 4/2020 | Yokoyama |
| 2020/0251431 A1 | 8/2020 | Priewasser et al. |
| 2021/0387259 A1 | 12/2021 | Barnes et al. |
| 2022/0028722 A1 | 1/2022 | Miyazawa et al. |
| 2022/0077101 A1 | 3/2022 | Morita |
| 2022/0127496 A1 | 4/2022 | Puligadda et al. |
| 2022/0306177 A1 | 9/2022 | Schroder et al. |
| 2022/0319872 A1 | 10/2022 | Akasu et al. |
| 2022/0376264 A1 | 11/2022 | Albano et al. |
| 2022/0399313 A1 | 12/2022 | Park et al. |
| 2023/0178362 A1 | 6/2023 | Rose et al. |
| 2023/0207374 A1 | 6/2023 | Akasu et al. |
| 2023/0360947 A1 | 11/2023 | Oyama et al. |
| 2023/0369093 A1 | 11/2023 | Oyama et al. |
| 2024/0006192 A1 | 1/2024 | Sobue et al. |
| 2024/0321816 A1 | 9/2024 | Attar et al. |
| 2025/0002283 A1 | 1/2025 | Attar et al. |

FOREIGN PATENT DOCUMENTS

| | | |
|---|---|---|
| DE | 102023132323 A1 | 6/2024 |
| EP | 2555879 B1 | 2/2017 |
| EP | 2347638 B1 | 12/2018 |
| JE | 5017082 B2 | 6/2012 |
| JP | S63145077 A | 6/1988 |
| JP | 2004064040 A | 2/2004 |
| JP | 2005159155 A | 6/2005 |
| JP | 2006080142 A | 3/2006 |
| JP | 2010239057 A | 10/2010 |
| JP | 4868708 B2 | 2/2012 |
| JP | 2012109538 A | 6/2012 |
| JP | 2012126803 A | 7/2012 |
| JP | 2012206266 A | 10/2012 |
| JP | 2013033814 A | 2/2013 |
| JP | 2013110352 A | 6/2013 |
| JP | 5257314 B2 | 8/2013 |
| JP | 5324821 B2 | 10/2013 |
| JP | 5463170 B2 | 4/2014 |
| JP | 2015013977 A | 1/2015 |
| JP | 2016011361 A | 1/2016 |
| JP | 2016086158 A | 5/2016 |
| JP | 2016138182 A | 8/2016 |
| JP | 6157890 B2 | 7/2017 |
| JP | 6624065 B2 | 12/2019 |
| JP | 6634795 B2 | 1/2020 |
| JP | 2020192815 A | 12/2020 |
| KR | 20130116294 A * | 10/2013 |
| WO | 2006062826 A2 | 6/2006 |
| WO | 2006096205 A2 | 9/2006 |
| WO | 2013116071 A1 | 8/2013 |
| WO | 2013158122 A1 | 10/2013 |
| WO | 2014088546 A | 6/2014 |
| WO | 2019143358 A1 | 7/2019 |
| WO | 2021251985 A1 | 12/2021 |
| WO | 2022040646 A1 | 2/2022 |
| WO | 2022211805 A1 | 10/2022 |
| WO | 2023101693 A1 | 6/2023 |

* cited by examiner

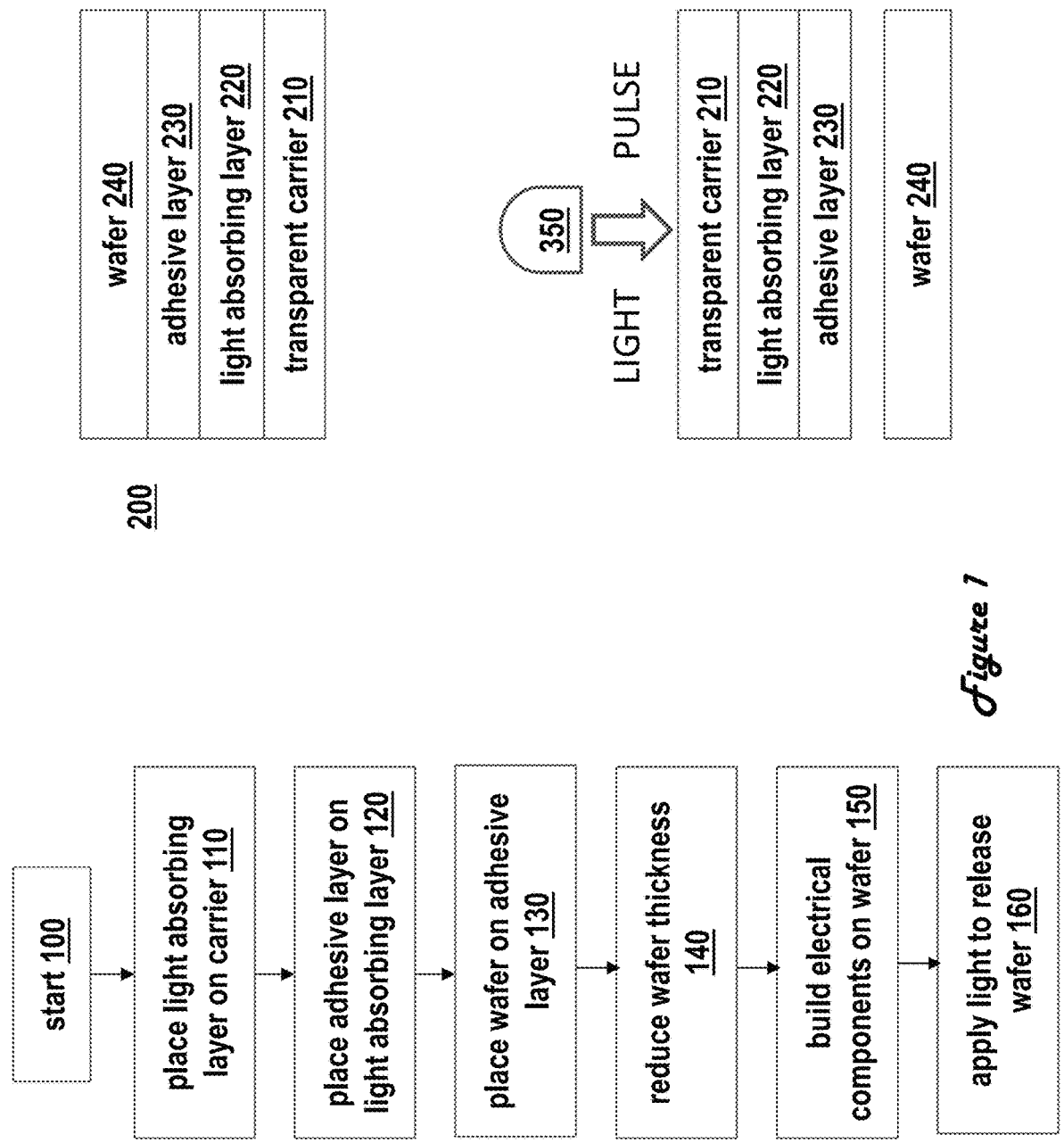

METHOD AND APPARATUS FOR DEBONDING TEMPORARILY BONDED WAFERS IN WAFER-LEVEL PACKAGING APPLICATIONS

RELATED APPLICATIONS

The present application is a continuation application of U.S. Ser. No. 17/122,796, filed on Dec. 15, 2020.

TECHNICAL FIELD

The present application relates to method and apparatus for processing integrated circuits in general, and, in particular, to a method and apparatus for debonding temporarily bonded wafers in wafer-level packaging applications.

BACKGROUND

Three-dimensional (3D) chip technologies have been gaining popularity in the microelectronics industry because of their advantages such as shorter circuit paths, higher performance, less power consumption and faster heat dissipation. With 3D chip technologies, multiple heterogeneous silicon wafers can be stacked vertically to form a 3D integrated circuit. The silicon wafers are relatively thin (50-100 μm) such that they can be interconnected by utilizing through-silicon vias (TSVs).

During the manufacturing of a 3D integrated circuit, a thinning step is required to be performed on each silicon wafer of the 3D integrated circuit in order to reduce the thickness of the silicon wafer. The silicon wafer is typically bonded to a rigid carrier prior to the thinning process. Existing approaches for bonding a silicon wafer to a carrier involve the use of an adhesive placed directly between the silicon wafer and the carrier. After back-grinding and all the required backside processing have been performed on the silicon wafer, the thinned silicon wafer needs to be debonded from the carrier. Wafer debonding is the process of separating the processed silicon wafer from the carrier so that the processed wafer can progress to its intended application.

The present disclosure provides an apparatus and method for debonding a silicon wafer from a carrier during the manufacturing of 3D integrated circuits.

SUMMARY OF THE INVENTION

In accordance with one embodiment, a light-absorbing layer is placed on a carrier. A wafer is then attached to the light-absorbing layer of the carrier via an adhesive layer to form a bonded wafer stack. After processing the wafer has been processed, a light pulse from a flashlamp is applied to a non-wafer side of the carrier to heat the light-absorbing layer and the adhesive layer in order to loosen the wafer from the bonded wafer stack. Finally, the wafer is removed from the bonded wafer stack.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein:

FIG. 1 is a flow diagram of a method for debonding a wafer from a carrier, according to one embodiment;

FIG. 2A is a diagram of a bonded wafer stack made by the method depicted in FIG. 1;

FIG. 2B shows a wafer being released from the bonded wafer stack from FIG. 2A;

DETAILED DESCRIPTION OF A PREFERRED EMBODIMENT

Figure 3:
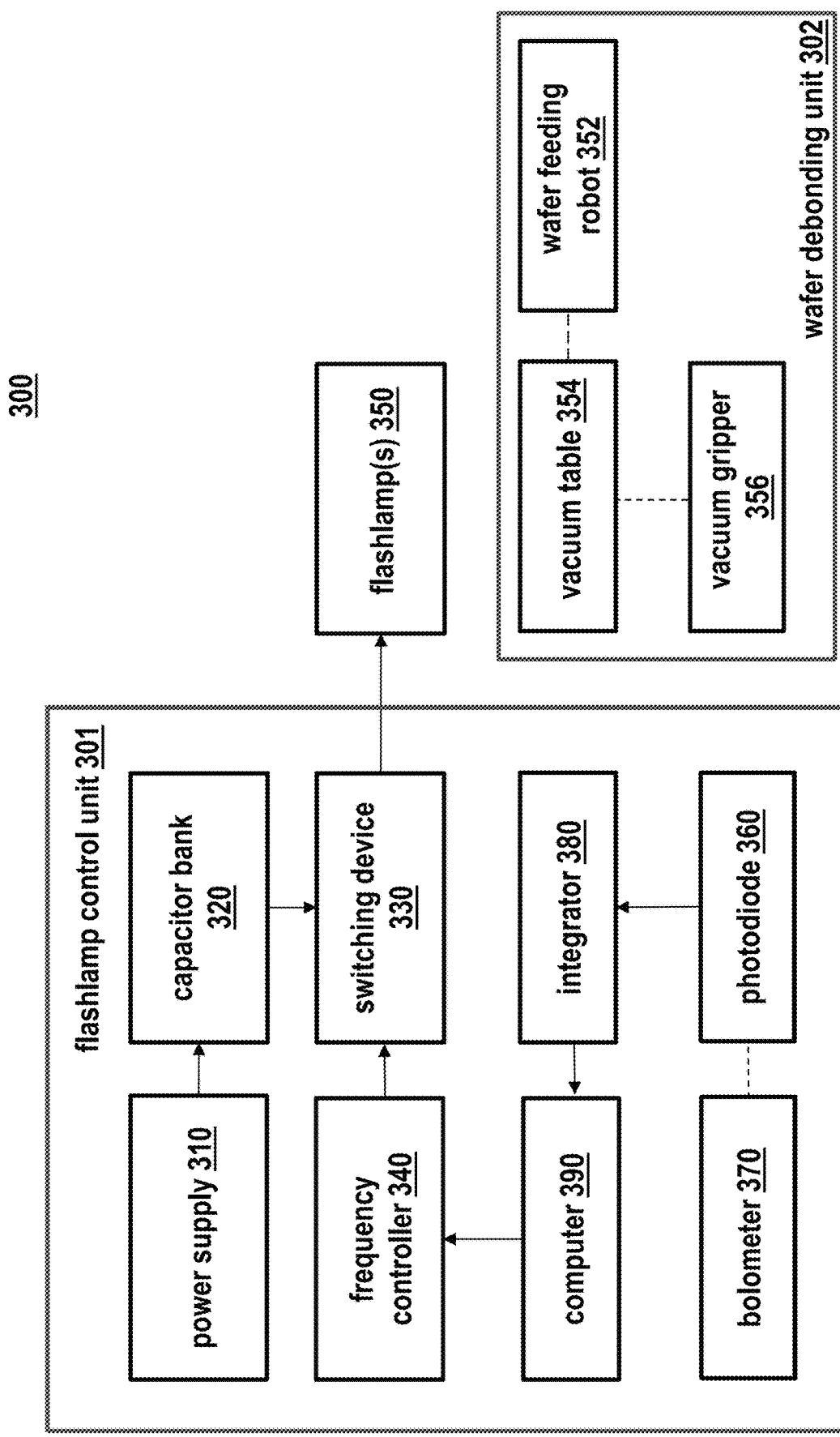
FIG. 3 is a block diagram of an apparatus for debonding a wafer from a carrier, according to one embodiment.

Current techniques for debonding a silicon wafer from a carrier include: (a) using chemical solvents to dissolve the adhesive between the silicon wafer and the carrier, (b) using mechanical means to debond the silicon wafer off the carrier, and (c) heating the adhesive between the silicon wafer and the carrier to a point where the silicon wafer can be separated from the carrier by shearing. However, the usage of harsh chemicals is not very desirable. Also, shearing or high temperature may cause damage to the surface structure of the silicon wafer.

The laser-assisted wafer debonding technique is an attractive alternative due to its ability to debond silicon wafers at room temperature. However, there are also some disadvantages associated with the laser-assisted wafer debonding technique, such as variations in the sensitivity of a laser beam's focal point with variation in the thickness of a wafer-carrier stack, power fluctuations of the laser beam, requirement of special beam focusing objectives, need for scanning optics, and low throughput due to beam width limitations, especially when processing a larger size wafer (>300 mm).

Referring now to the drawings and in particular to FIG. 1, there is depicted a flow diagram of a method for debonding a wafer from a carrier, according to one embodiment. Starting at block 100, a light absorbing layer, such as a light absorbing layer 220 in FIG. 2A, is initially placed on one side of a transparent carrier, such as a transparent carrier 210 in FIG. 2A, as shown in block 110. Light absorbing layer 220 can be applied on carrier 210 via sputtering, thermal evaporation, atomic layer deposition or vapor deposition. Light absorbing layer 220 may include a minority of another refractory metal, such as titanium, to promote adhesion to carrier 210.

Carrier 210 and light absorbing layer 220 are materials chosen to be thermally stable at an elevated temperature and have coefficients of thermal expansion (CTE) that are closely matched with each other in order to mitigate any kind of cracking or delamination of light absorbing layer 220 from carrier 210 when light absorbing layer 220 is heated.

Carrier 210 may be made of quartz, glass or any rigid material which transmits light emitted by a flashlamp. Quartz has a CTE of $5.5 \times 10^{-7}$/K. Corning Eagle XG (a type of glass) has a CTE of about $3.2 \times 10^{-6}$/K to $3.5 \times 10^{-6}$/K. Light absorbing layer 220 may be made of metal (such as tungsten or molybdenum), metal alloy, or ceramic. Molybdenum has a CTE of $4.8 \times 10^{-6}$/K, while tungsten has a CTE of $4.5 \times 10^{-6}$/K.

One example of a good carrier-absorbing layer combination is Corning Eagle XG for carrier 210 and 90% tungsten/10% titanium at 200 nm thick for light absorbing layer 220 because the CTE between them is matched to within $1.5 \times 10^{-6}$/K.

An adhesive layer, such as an adhesive layer 230 in FIG. 2A, is then placed on light absorbing layer 220, as depicted in block 120. Adhesive layer 230 should have an adhesion strength of at least 15 psig, preferably from 50-250 psig, as determined by ASTM D4541/D7234. Adhesive layer 230 can be applied to carrier 210 in a liquid or solid film.

Adhesive layer 230 may be a thermoplastic or a cross-linkable material that is thermally or ultra-violet (UV) light cured. Adhesive layer 230 may include a polymer or oligomer dissolved or dispersed in a solvent. The polymer or oligomer is selected from a group consisting of polymers and oligomers of cyclic olefins, epoxies, acrylics, silicones, styrenics, vinyl halides, vinyl esters, polyamides, polyimides, polysulfones, polyethersulfones, cyclic olefins, polyolefin rubbers, polyurethanes, ethylene-propylene rubbers, polyamide esters, polyimide esters, polyacetals, polyazomethines, polyketanils, polyvinyl butyrals, and combinations thereof. The type of solvent used depends on the choice of polymer or oligomer.

The thermoplastic composition of adhesive layer 230 should have a viscosity at least 500,000 Pa-s, preferably from 1,000,000 Pa-s to 3,000,000 Pa-s, at room temperature, and a viscosity of less than 15,000 Pa-s, preferably from 500 Pa-s to 10,000 Pa-s, at temperatures between 160° C. and 500° C.

Adhesive layer 230 may be a nonpolymeric material with the structure of the molecule having less than one repeating subunit. When a nonpolymeric bonding material is used, the melting point of adhesive layer 230 should be below its sublimation point and has the ability to crosslink or further react in order to prevent material sublimation at high temperatures. The thermal decomposition temperature of adhesive layer 230 should be between 220° C. and 450° C.

Next, a wafer, such as a wafer 240 in FIG. 2A, is placed on adhesive layer 230, as shown in block 130. Pressure can be applied on wafer 240 to adhere wafer 240 to carrier 210. Wafer 240 may be heated during the application of pressure onto wafer 240 in order to increase the adhesive bond between carrier 210 and wafer 240. At this point, a bonded wafer stack is formed, such as a bonded wafer stack 200 shown in FIG. 2A, which includes transparent carrier 210, light absorbing layer 220, adhesive layer 230, and wafer 240.

Subsequently, the wafer side of bonded wafer stack 200 is subjected to a back-thinning process in order to reduce the thickness of wafer 240, as depicted in block 140. After the thickness of wafer 240 has been reduced, electronic devices and/or electrical components can be built on wafer 240, as shown in block 150. Although the device fabrication step is shown to be performed after the thinning step, it is understood by those skilled in the art that the device fabrication step can be performed before the thinning step or the wafer attachment step (block 130).

Afterwards, wafer 240 can be removed (debonded) from bonded wafer stack 200 by exposing the non-wafer side of transparent carrier 210 to an intense pulse of light from a flashlamp, such as a flashlamp 350 in FIG. 2B, as depicted in block 160, in order to heat up light absorbing layer 220. In turn, light absorbing layer 220 conducts the absorbed heat to adhesive layer 230. As a result, adhesive layer 230 is heated to a point that wafer 240 will be released from bonded wafer stack 200.

It is desirable to have light absorbing layer 220 to absorb as much of the light pulse (which is broadband from about 200 nm to about 1,500 nm) as possible. Increased absorbance of the light pulse from flashlamp 350 that a shorter pulse length can be used at a given intensity. This results in less stress on flashlamp 350 and less total energy deposited into wafer 240 from the debonding process. Molybdenum has an absorbance of about 55-60%, while tungsten has an absorbance of about 50-55%. Light absorbing layer 220 can be made thick enough to not pass the light emission from flashlamp 350 but thin enough to have as little thermal mass as possible during the debonding process. The thickness of light absorbing layer 220 is about 100 nm-300 nm, and preferably about 150 nm-250 nm.

Referring now to FIG. 3, there is depicted a block diagram of an apparatus for performing debonding of a wafer from a carrier, according to one embodiment. As shown, an apparatus 300 includes a flashlamp control unit 301 and wafer debonding unit 302. Flashlamp control unit 301 includes a capacitor-bank-charging power supply 310, a capacitor bank 320, an insulated gate barrier transistor (IGBT)-based switching device 330, a frequency controller 340, a photodiode 360, a bolometer 370, an integrator 380, and a computer 390. Computer 390 includes a processor and various storage devices that are well-known to those skilled in the art. The capacitors in capacitor bank 320 are, for example, electrolytic capacitors. Capacitor bank 320 may alternatively be switched with a silicon controlled rectifier (SCR) switching device.

Capacitor bank 320 can be charged by capacitor-bank-charging power supply 310. Charges from capacitor bank 320 are then discharged into flashlamp 350 via IGBT-based switching device 330 while IGBT-based switching device 330 is being switched on-and-off repeatedly by frequency controller 340 during the discharge. Frequency controller 340 controls the gating of IGBT-based switching device 330 that, in turn, controls the switching frequency of the discharge. The repeated on-and-off switching of IGBT-based switching device 330 is intended to modulate the current flow from capacitor bank 320 to flashlamp(s) 350, which in turn switches flashlamp(s) 350 on and off. In other words, the frequency or pulse length of light pulses emitted by flashlamp(s) 350 is dictated by frequency controller 340.

Photodiode 360 within flashlamp control unit 301 needs to be calibrated before operation. Photodiode 360 can be calibrated by using bolometer 370 that is National Institute of Standards and Technology (NIST) traceable. During calibration, both photodiode 360 and bolometer 370 are exposed to a single light pulse emitted from flashlamp 350. Bolometer 370 measures the radiant exposure or energy per area (in unit $J/cm^2$) of the single light pulse, and photodiode 360 measures the instantaneous power density (in unit $W/cm^2$) of the same light pulse. The instantaneous power density signals from photodiode 360 are then integrated by integrator 380 to yield a radiant exposure value of the same single light pulse, and the radiant exposure measurement from bolometer 370 is divided by this radiant exposure value from integrator 380 to generate a calibration factor as follows:

$$\text{Calibration factor} = \frac{\text{radiant exposure measurement}}{\text{radiant exposure value}}$$

After calibration, the photodiode 360/integrator 380 combination can be utilized to provide radiant exposure information of each light pulse emitted from flashlamp 350. Basically, the radiant exposure information of a light pulse emitted from flashlamp 350 can be calculated by multiplying the calibration factor obtained during calibration with the output value of integrator 380 (which is the radiant exposure value of the light pulse emitted from flashlamp 350 formed by integrating the instantaneous power signals of the light pulse emitted from flashlamp 350 measured by photodiode 360).

Wafer debonding unit 302 includes a wafer feeding robot 352, a debonding vacuum table 354, and a vacuum gripper 356.

Figure 4:
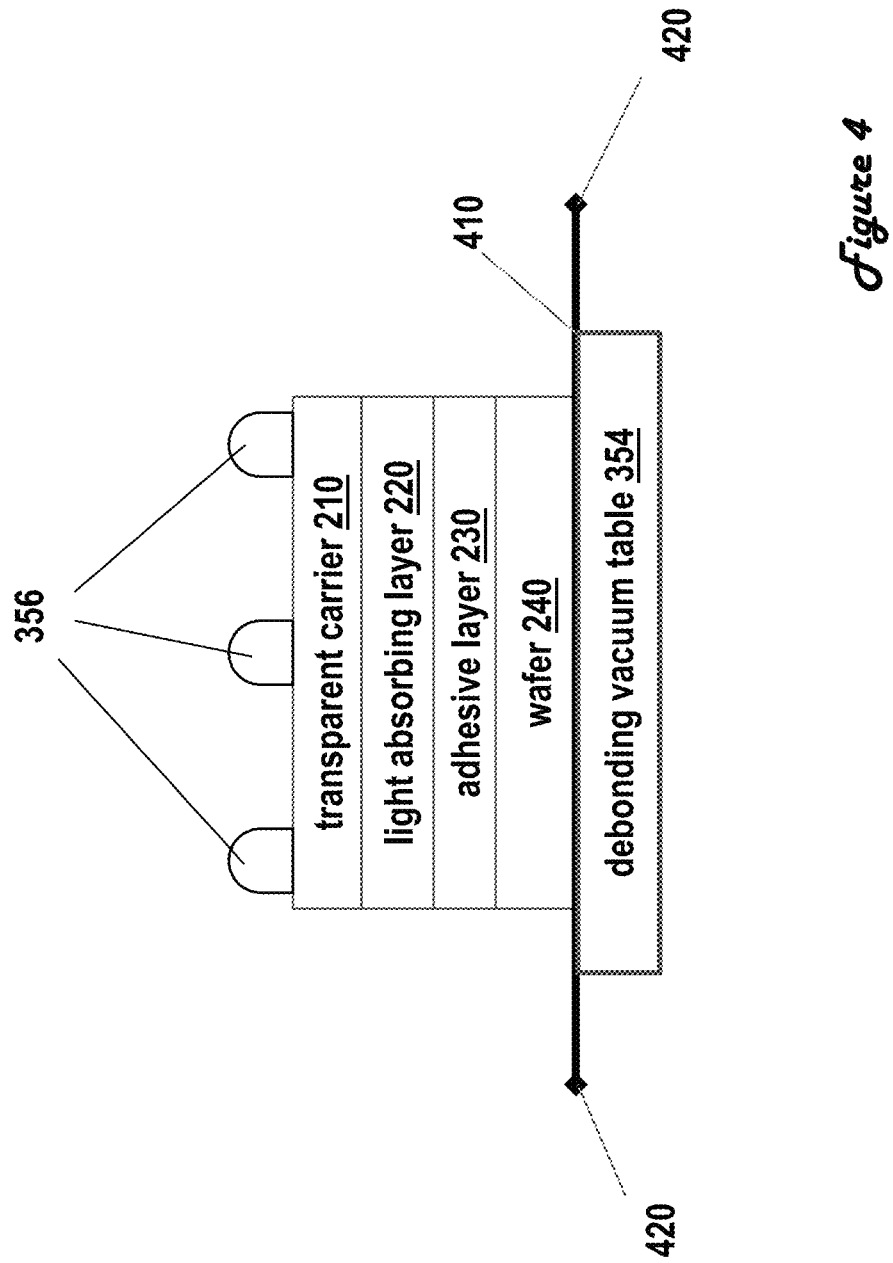
FIG. 4 illustrates a debonding vacuum table holding down a bonded wafer assembly, according to one embodiment.

Prior to debonding, a dicing tape 410 is mechanically clamped to wafer stack 200 via retaining rings 420 to form a bonded wafer assembly, as shown in FIG. 4. Wafer feeding robot 352 conveys the bonded wafer assembly to debonding vacuum table 354. A vacuum is then applied on dicing tape 410 from debonding vacuum table 354, as shown in FIG. 4. Then, an intense light pulse from flashlamp 350 is utilized to illuminate the bonded wafer assembly from the transparent side of carrier 210 to debond processed wafer from carrier 210. If the beam area of flashlamp 350 is smaller than the area of wafer 240, then wafer 240 is conveyed relative to flashlamp 350 by debonding vacuum table 354 to expose the remaining portions of wafer 240 with another intense light pulse. Next, the bonded wafer assembly along with wafer debonding table 354 is conveyed to a separation station.

At the separation station, vacuum gripper 356 separates carrier 210 from the bonded wafer assembly, while wafer 240 mounted on dicing tape 410 is being held down by debonding vacuum table 354. Both carrier 210 and wafer 240 on dicing tape 410 are conveyed to a cleaning station to remove any residual adhesive (i.e., adhesive layer 230 from FIG. 2A). Residual adhesive may be removed with a wet process via solvent or a dry process with plasma.

At this point, wafer 240 is so fragile that the vacuum being applied to wafer 240 should be distributed across wafer 240 so as not to break it during removal. This may be accomplished with multiple suction cups 430 distributed across the surface of wafer 240. Alternatively, the vacuum may be applied by a distributed vacuum, such as a vacuum table with perforated holes. Vacuum table 354 may have a polymer on its surface so that wafer 240 is not damaged during handling.

During the debonding process, apparatus 300 may have 5-lamp drivers per flashlamp using 24 mm diameter and 150 mm long lamps with 150 mm×75 mm exposure area per lamp. The flashlamps may be placed parallel to each other to increase the exposure area in increments of 75 mm. For example two flashlamps provide an exposure area of 150 mm×150 mm, three flashlamps provide an exposure area of 150 mm×225 mm, four flashlamps provide an exposure area of 150 mm×300 mm, etc. The flashlamps are placed in a common optical cavity, and the exposure is uniform to within 3%. Flashlamp drivers contain capacitors and IGBTs. The current from the capacitors is switched by the IGBTs into the flashlamps. Lamp drivers may be placed in parallel with each other to increase the peak current supplied to the flashlamps. A variable of the flashlamp system is the charging voltage of the capacitors, the total capacitance, which is determined by the number of flashlamp drivers, and the length of the pulse of light, which is switched on and off by the IGBTs. All parameters are controlled by a computer. Silicon wafer may be debonded from glass carrier plates at 900-950V at pulse durations of 50-150 microseconds, which corresponds to 2-6 J/cm$^2$ emitted with each pulse. The peak radiant power of flashlamp 350 is greater than 20 KW/cm$^2$, more preferable greater than 30 KW/cm$^2$, and even more preferable greater than 40 KW/cm$^2$.

It is noted that the thinner the wafer, the easier it is for the wafer to be debonded from a carrier plate. This is principally due to the fact that the wafer, is very thermally conductive. Silicon, for example, has a thermal conductivity of about 140 W/cm-K. This is over 100 times greater than the typical carrier plate, which is glass. As such, much of energy from the light absorbing layer is conducted to the wafer through the adhesive layer during the 50-150 microsecond long time the absorber is being irradiated by the pulse of light. When the adhesive layer reaches the debond temperature, it debonds from the carrier. The thinner the wafer, the quicker the adhesive reaches the debond temperature. Thus, a thinner wafer may be debonded with a shorter pulse of light at the same intensity. An advantage of this is that less energy is needed to perform the debond process. Additionally, the lifetime of the flashlamps in the flashlamp system is increased since duration is decreased. Alternatively, the intensity of the emission from the flashlamp may be decreased for a given pulse length. This also reduces the total amount of energy deposited into the wafer.

As has been described, the present invention provides an improved method for debonding a wafer from a carrier. There are several advantages of the present invention over the prior art. The first is that the wafer debonding can be performed with as little a single pulse of light. This means that the time to debond the wafer from the stack is dramatically reduced from several 10s of seconds (or longer) to less than 150 microseconds for a single pulse or less than 10 seconds, or even less than 2 for two pulses. Another advantage over the prior art is that the need for rastering the light emission to scan the entire wafer is greatly reduced or eliminated. This dramatically reduces the complexity of the apparatus by eliminating the need for complex scanning optics. A further advantage over the prior art is that the inhomogeneities in the debonding process from hundreds of pulses are greatly reduced since the entire wafer sees the same time temperature history from one or two pulses of light. The same time temperature history in the debonding process has the implication that the wafer is more cleanly debonded than in the prior art. This further reduces the amount of time it takes to remove any residual bonding adhesive from the wafer and carrier plate at the cleaning station over the prior art.

While the invention has been particularly shown and described with reference to a preferred embodiment, it will be understood by those skilled in the art that various changes in form and detail may be made therein without departing from the spirit and scope of the invention.

What is claimed is:

1. A flashlamp debonding system for debonding a manufacturing assembly comprising an electronics structure, wherein the electronics structure is temporarily bonded to a remainder of the manufacturing assembly, the flashlamp debonding system comprising:
   a flashlamp configured to emit light pulses to illuminate the manufacturing assembly for debonding the electronics structure from the remainder of the manufacturing assembly;
   a flashlamp control subsystem for controlling the flashlamp, the flashlamp control subsystem comprising:
      a capacitive device; and
      an electronic switch device; and
   a debonding subsystem including:
      a support configured to support the manufacturing assembly;
      a feeder configured to feed the manufacturing assembly to the support for receiving illumination from the flashlamp; and a separator configured to separate the electronics structure from the remainder of the manufacturing assembly after the manufacturing assembly has received illumination from the flashlamp.

2. The system of claim 1, wherein the debonding subsystem comprises at least one vacuum device.

3. The system of claim 2, wherein the at least one vacuum device is configured to apply distributed pressure across the electronics structure.

4. The system of claim 2, wherein the at least one vacuum device comprises a plurality of suction cups.

5. The system of claim 2, wherein the support comprises the at least one vacuum device, and wherein the separator comprises at least one gripper for separating the remainder of the manufacturing assembly from the electronics structure.

6. The system of claim 5, wherein the gripper comprises a vacuum gripper.

7. The system of claim 1, wherein the support is configured to retain the electronics structure while the separator separates the electronics structure from the remainder of the manufacturing assembly.

8. The system of claim 1, the flashlamp control subsystem further comprising a frequency controller configured to modulate a current flowing from the capacitive device to the electronic switch device to cause the flashlamp to emit light pulses.

9. The system of claim 1, wherein the electronic switch device comprises one of an IGBT-based switching device or a silicon controlled rectifier switching device.

10. The system of claim 1, wherein the debonding subsystem is configured to convey the manufacturing assembly relative to the flashlamp while light pulses are emitted by the flashlamp.

11. The system of claim 10, wherein the manufacturing assembly comprises a plurality of debonding regions; and
wherein the debonding subsystem is configured to convey the manufacturing assembly relative to the flashlamp such that each one of the plurality of debonding regions is exposed to illumination from the flashlamp.

12. The system of claim 1, wherein the feeding device comprises a robot.

13. The system of claim 1, further comprising a flashlamp calibration subsystem;
wherein the flashlamp calibration subsystem is configured to determine a flashlamp calibration factor based on an energy parameter of a reference light pulse emitted by the flashlamp; and
wherein the flashlamp control subsystem is configured to control the flashlamp as a function of the flashlamp calibration factor.

14. The system of claim 13, wherein the flashlamp calibration subsystem comprises a first light sensor and a second light sensor, wherein the determination of the flashlamp calibration criterion comprises comparing a first signal generated by the first light sensor in response to the reference light pulse with a second signal generated by the second light sensor in response to the reference light pulse.

15. The system of claim 14, wherein the first light sensor comprises a photodiode and the second light sensor comprises a bolometer.

16. The system of claim 13, wherein the flashlamp calibration subsystem is further configured to determine an energy parameter of at least one light pulse emitted by the flashlamp for debonding the electronics structure from the remainder of the manufacturing assembly.

* * * * *